United States Patent [19]

Scales, Jr. et al.

[11] Patent Number: 5,060,370
[45] Date of Patent: Oct. 29, 1991

[54] MODIFICATION METHOD FOR ETCHED PRINTED CIRCUIT BOARDS

[76] Inventors: James W. Scales, Jr., 13160 Via Arriba Ct., Saratoga, Calif. 95070; Walter L. Marks, 293 Spreading Oak Dr., Scotts Valley, both of Calif. 95066

[21] Appl. No.: 597,813

[22] Filed: Oct. 15, 1990

[51] Int. Cl.⁵ .............................................. H05K 3/02
[52] U.S. Cl. .................................. 29/846; 29/402.16; 174/261; 228/119; 437/8
[58] Field of Search ..................... 29/402.16, 846, 847; 228/119; 174/261; 437/8

[56] References Cited

U.S. PATENT DOCUMENTS

| | | | |
|---|---|---|---|
| 3,762,040 | 10/1973 | Burns et al. | 174/261 X |
| 4,000,054 | 12/1976 | Marcantonio | 29/846 X |
| 4,178,678 | 12/1979 | Carrillo et al. | |
| 4,179,322 | 12/1979 | Brown et al. | 156/192 |
| 4,200,975 | 5/1980 | Debiec et al. | 29/847 X |
| 4,255,613 | 3/1981 | Ketchpel | 174/261 X |
| 4,259,367 | 3/1981 | Dougherty, Jr. | 437/8 X |
| 4,438,561 | 3/1984 | Mueller | 29/846 X |
| 4,601,915 | 7/1986 | Allen et al. | 174/261 X |
| 4,803,544 | 2/1989 | Holzschuh et al. | 357/72 |
| 4,806,106 | 2/1989 | Mebane et al. | 439/77 |
| 4,908,938 | 3/1990 | Thorwarth et al. | 228/119 X |
| 4,918,264 | 11/1983 | Thorwarth | 29/402.16 X |

OTHER PUBLICATIONS

E-Z Circuit by Bishop Graphics, Inc.—Printed Circuit Copper Products Technical Manual & Catalog EZ-3001, pp. 2-7.

Primary Examiner—Carl J. Arbes
Attorney, Agent, or Firm—Schneck & McHugh

[57] ABSTRACT

A method of improving or modifying a fabricated circuit board having a circuit pattern of board traces etched thereon. First and second locations on the printed circuit board are identified for electrical connection of the two locations for the purpose of modifying the circuit board. A path is then selected from the first location to the second location generally without crossing of etched board traces. A metallic panel is provided and metal is removed from the panel to form a plurality of lay-flat traces in a configuration to match the selected path. Preferably, the lay-flat traces are plated with copper and then tin or solder. An overcoating of an insulating material, such as photo-imageable solder mask, is then applied. One of the lay-flat traces can then be removed from the panel and installed on the board to follow the selected path from the first location to the second location. Annular pads at the opposed ends of the lay-flat trace are soldered to the two locations. The plating of copper and solder may be applied after the application of the insulative overcoating. The method provides a low-visibility, easy-to-install interconnection without jeopardizing the performance of the printed circuit board.

20 Claims, 2 Drawing Sheets

MODIFICATION METHOD FOR ETCHED PRINTED CIRCUIT BOARDS

DESCRIPTION

1. Technical Field

The present invention relates generally to methods of providing interconnections on a printed circuit board and more particularly to methods of modifying a printed circuit board having conductive traces fabricated thereon.

2. Background Art

In the manufacture of printed circuit boards, there is a very large number of possible circuit patterns for providing electrical communication along the board. A circuit pattern is typically etched onto one surface of the circuit board, whereafter modifications, improvements and repairs are difficult. In providing changes to the circuit interconnection patterns of a production-made printed circuit board, important factors to be considered include ease of repair, performance and maintaining the professional appearance of the printed circuit board.

Holzschuh et al. U.S. Pat. No. 4,803,544 teaches a prefabricated strip connector network module adapted to be installed on a printed circuit board. Because the device is manufactured as a module, a circuit can be added to a printed circuit board without requiring further fabrication of the board. Mebane et al. U.S. Pat. No. 4,806,106 teaches a lead frame for interconnecting a thermal ink jet printhead to a printed circuit board. The lead frame has a plurality of conductive fingers which are spring biased at a predetermined angle to provide good compressive electrical contact between interconnected members. U.S. Pat. Nos. 4,179,322 to Brown et al. and 4,178,678 to Carrillo et al. teach methods of affixing finger contacts to the edge of a printed circuit board. The finger contacts are supplied on a reel and allow the edge of the printed circuit board to be plugged into a multi-contact connector for electrical communication between the board and some other device via the connector. Each of the above-cited patents teaches a device which functions well in the application for which it is designed, but each device is limited in its application.

The above-cited methods are not designed to provide electrical contact between a first location on a printed circuit board to a second location on the same board after fabrication of the board. For example, after etching of the circuit pattern of the printed circuit board, it may be discovered that proper functioning of the loaded circuit board requires electrically connecting a pin on a first integrated circuit package to a pin on a second integrated circuit package. A conventional method for providing such an electrical connection after fabrication is to strip insulation from an appropriate length of small gauge insulated hookup wire and wrap the uninsulated ends of the wire about the two pins of the two integrated circuit packages. A properly installed hookup wire requires a wrapping of at least 180 degrees and preferably 360 degrees about the pins. The hookup wire is then soldered to the two pins. Insulation on the hookup wire must not touch the soldered joint, but to minimize the risk of shorting between pins of an integrated circuit package, the insulation should not be more than 0.025 inch from the soldered joint. Adding the small gauge insulated hookup wire to a printed circuit board is considered a high-skill task and is dependent on operator judgment. Errors which cause board failure are not uncommon. Moreover, the added hookup wire is easily distinguishable from the etched interconnections of the circuit board, detracting from the aesthetics of the circuit board.

Another method of providing interconnections on a printed circuit board is to use general purpose conductor strips. For example, a conductor strip may be provided on a roll. The desired length is then unrolled and cut from the remainder of the roll. Preferably, the conductive material has a pressure-sensitive on one side of the material so that the conductor strip may be adhered to the board. The strip should overlay the first and second locations by a distance of at least 0.0625 inch. The ends of the conductor strip are then soldered to the overlapped first and second locations. It is also possible to use general purpose doughnut pads to repair existing pads or to strengthen the bond of the conductor strips to the interconnected locations. This method provides certain advantages over the method of using insulated hookup wire. However, interconnecting locations of a printed circuit board having an etched circuit pattern typically requires a lay-flat connector strip to make a number of turns. Bending of a general purpose conductor strip will jeopardize the integrity of the strip and the performance of the board. Moreover, the conductor strips are easily distinguishable from the etched circuit board traces.

It is an object of the present invention to provide a method of modifying, improving or repairing a prefabricated printed circuit board, while maintaining the standard of performance and the professional appearance of the circuit board.

SUMMARY OF THE INVENTION

The above object has been met by fabrication of a plurality of prerouted lay-flat board traces supported within a panel. The prerouted board traces may be used for modification or improvement of a production-run of printed circuit boards having a circuit pattern of conductive traces fabricated on a surface thereof.

After manufacture of a number of printed circuit boards, it may be discovered that one or more additional traces would improve the performance of the circuit board. First and second locations on the circuit board are identified for interconnection, whereafter a path is selected for placement of the additional board trace. The path should not cross existing traces and should be selected to meet any relevant impedance and capacitance requirements. A plurality of low-profile board traces are then fabricated by removing a pattern of metal from a metallic panel. The removal of metal is in a pattern to configure the board traces so that each board trace is adapted to track the selected path. Preferably, the metal is removed by use of a chemical milling technique. The chemical milling leaves narrow lands from the panel to the board traces, so that the panel acts as a frame to support the traces until use.

The fabrication of the prerouted board traces may include providing pads at both ends of each trace in a manner such that the pads and the trace are a unitary body. Alternatively, the pads may be attached after formation of the traces. Typically, the pads are annular, having an inside diameter to receive the leads of an electrical component. Inclusion of pads, however, is not critical.

To enhance conductivity, the prerouted board traces may be electroplated with copper. An overplating of tin or solder facilitates bonding of the board traces to the printed circuit board at a later stage. It is preferred that the traces be suitably insulated by a coating of solder mask or the like. A unique feature of the approach is that of use of photo chemical machining the board traces in conjunction with a photo imageable solder mask.

A lay-flat prefabricated board trace is then removed from the panel by the breaking of the lands which attach the board trace to the panel. The removed board trace is then brought into contact with the printed circuit board along the selected path from the first location to the second location. Optionally, the length of the board trace may be bonded to the circuit board. The pads at the opposed ends of the board trace are soldered to the first and second locations. This installment may take place prior to, during or after loading of components onto the printed circuit board. The same procedure may be followed in applying the remaining board traces to printed circuit boards identical to the first modified circuit board.

One advantage of the present invention is that the prerouted board traces have greatly reduced visibility relative to jumper wire techniques previously practiced in the art. Thus, the printed circuit board retains its professional appearance.

Another advantage is that installation of the prerouted board trace requires less skill than properly installing small gauge hookup wires. Moreover, the prerouted board traces may be installed either before, during or after loading of the electrical components onto the circuit board and may cross other traces on a printed circuit board.

Another advantage of the present invention is that the prerouted board traces are easily installed and less susceptible to workmanship errors. Use of the prerouted board traces facilitates control of impedance and RF noise.

Another advantage is that turns in the path which is followed in interconnecting the first and second locations do not require crimping, thereby not jeopardizing the integrity of the board trace.

BEST MODE FOR CARRYING OUT THE INVENTION

Figure 1:
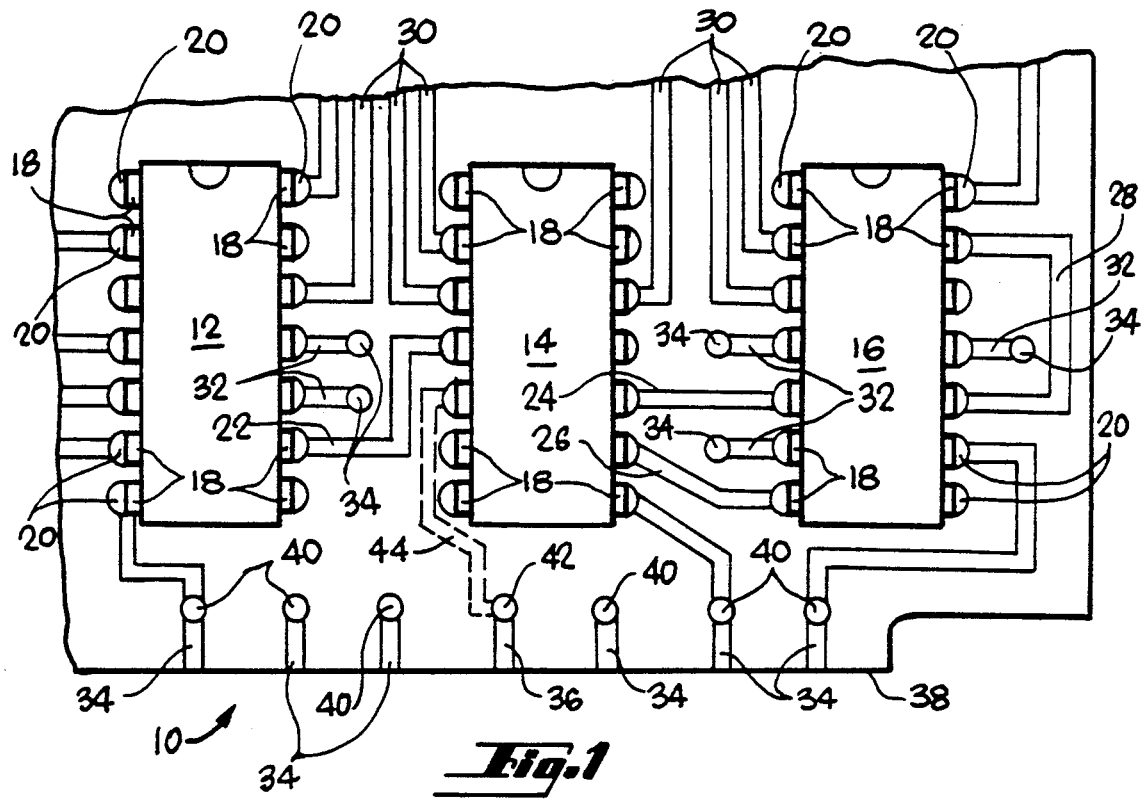
FIG. 1 is a top partial view of a printed circuit board showing a desired electrical path in phantom.

With reference to FIG. 1, a portion of a printed circuit board 10 is shown as including integrated circuit packages 12, 14 and 16. Each integrated circuit package includes fourteen pins 18. In practice, the pins are numbered consecutively, beginning with pin 1 in the upper right corner and progressing in a clockwise direction to pin 14 in the upper left corner. Each pin is received in a plated through-hole 20 of the printed circuit board 10. The pins 18 are then bonded to the through-holes 20 by wave soldering or any other technique known in the art. Alternatively, the integrated circuit packages may be leadless packages that do not include pins. Leadless chip packages are surface mounted to a printed circuit board.

Electrical communication among the integrated circuit packages 14–16 is accomplished by means of printed circuit board traces such as the trace 22 extending from pin 6 of the first package 12 to pin 11 of the second package 14. Circuit board traces 24 and 26 permit electrical communication between the center package 14 and the third package 16. Two pins 18 of the same integrated circuit package may also be electrically connected by a circuit board trace, as illustrated by trace 28 from pin 2 to pin 5 of the third integrated circuit package 16. In fabricating the printed circuit board 10 the traces 22-28 are formed by photolithography technology. Photolithography is well known in the art. Other technologies for etching of circuit board traces may also be utilized, as this is not a critical feature of the present invention.

Electrical communication between the integrated circuit packages 12, 14 and 16 and that portion of the printed circuit board 10 not shown in FIG. 1 is accomplished by etching of circuit board traces 30, which are shown as terminating at the cutoff portion of the board 10. In actuality, the traces 30 extend to other integrated circuit packages or to other types of electronic components. A number of circuit board traces 32 are shown as terminating at vias 34 in the printed circuit board. The vias are holes which penetrate the printed circuit board and which are plated with a conductive material. On the opposite side of the printed circuit board 10, other printed circuit board traces may be etched to extend from the vias 34 to other components on the printed circuit board. This etching of circuit board traces on both sides of the board allows for a greater number of interconnections. Circuit board traces should not cross one another. To even further increase the board real estate for the formation of traces, the printed circuit board may include interior layers for conductive paths from a via 34 to a second via.

The printed circuit board 10 must also communicate with circuitry not contained on the board. This is accomplished by formation of conductive fingers 35 and 36 at one edge 38 of the circuit board. The circuit board can then be plugged into an edge connector having an array of contact elements corresponding to the arrangement of the conductive fingers 35 and 36. Each of the conductive fingers intersects a via 40 and 42, whereafter a circuit board trace can extend either along the upper surface or the lower surface of the printed circuit board.

After fabrication of the printed circuit board 10 and after loading of the integrated circuit packages 12, 14 and 16, as well as all other electrical components, it may be discovered that operation of the circuitry can be improved by internal modification of the circuit board. One option would be to discard the fabricated printed circuit board and manufacture a replacement board including the modification. This would be a costly option, particularly where a manufacture run has fabricated a number of the circuit boards prior to discovery of the modification. A less costly option would be to revise the existing circuit boards. Such a revision must be made in a manner which does not jeopardize the performance of the circuitry and which maintains the professional appearance of the fabricated board.

A proposed modification to the printed circuit board 10 is shown by a phantom trace 44 in FIG. 1. The proposed modification links the conductive finger 36 to pin 10 of the center integrated circuit package 14. The path of the proposed trace 44 is chosen in accordance with impedance and capacitance requirements of the circuitry. Moreover, the selected path preferably should not cross other circuit board traces 22-32.

Figure 2:
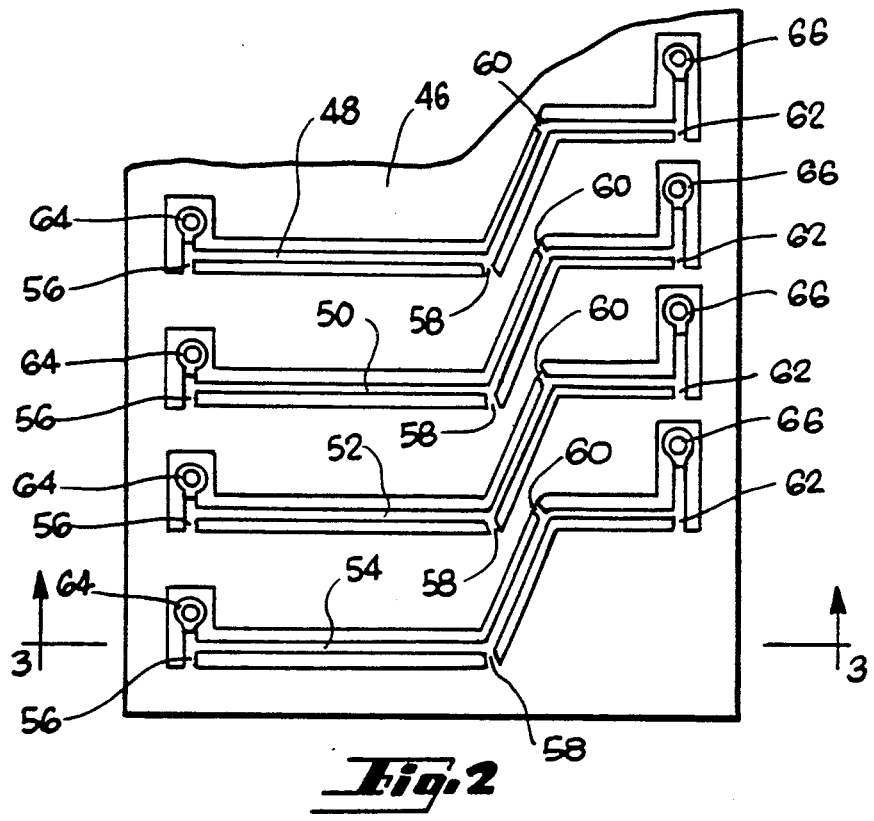
FIG. 2 is a top partial view of a frame having prerouted board traces for completing the desired electrical path of FIG. 1.

After selection of the path, the desired board trace must be formed for each of the previously manufactured printed circuit boards. In keeping with the present invention, a metallic panel is provided for repetitively producing the prerouted trace. Referring now to FIG. 2, material is removed from the metallic panel 46 to form a number of traces 48, 50, 52 and 54. The removal is preferably performed by means of a chemical milling technique. The traces are photochemically machined out of the panel 46. The panel may be made of spring temper brass, but this is not critical. Lands 56, 58, 60 and 62 are left for the purpose of supporting the traces 48-54 to the panel 46. The traces and the lands may also be formed by a stamping process or other means known in the art.

Attached to the opposed ends of the traces 48-54, are annular pads 64 and 66. The annular pads have the same dimensions as the via 42 of the conductive finger 36 shown in FIG. 1. The pads may be formed in the same process as the traces 46-54 in FIG. 2, so that the traces and pads are a unitary body. Alternatively, the pads may be bonded to the opposed ends of the traces. Inclusion of pads, however, is not critical.

Figure 3:
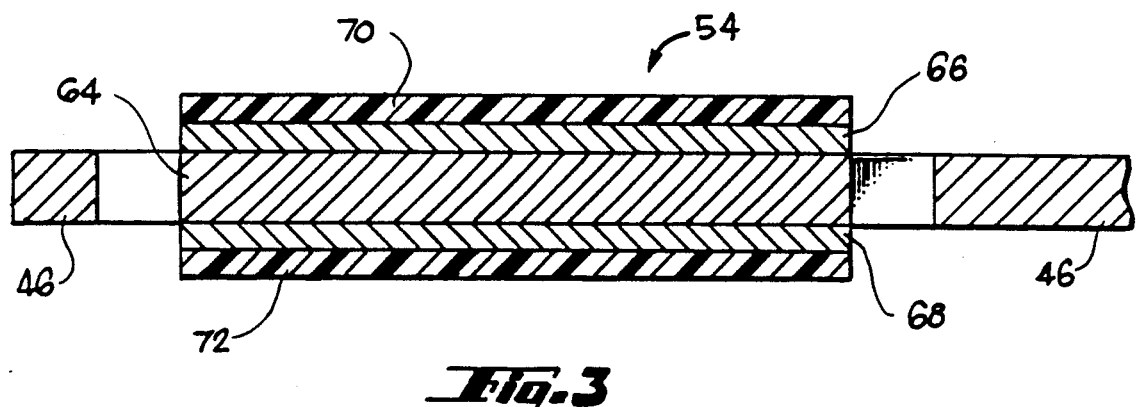
FIG. 3 is a rear sectional view of the frame of FIG. 2 taken along lines 3—3.

FIG. 3 is a sectional view of a portion of the lowermost trace 54 of FIG. 2, as well as the metallic panel 46. The trace is made up of a number of layers. The center layer is comprised of the same material as the panel 46. As noted above, the panel may be made of spring temper brass, but this is not critical. The thickness of the panel may be 0.002 inch, while the width of the trace may be 0.012 inch.

To enhance conductivity, the brass center layer 64 is electroplated to provide a copper layer 66 and 68 on each side of the center layer 64. Alternatively, silver or gold may be electroplated onto the brass layer 64. Where the less expensive copper coating is used, typically no masking is used, so that the panel 46 is coated as well as the trace 54. While not shown, the copper layers 66 and 68 may be overplated with tin or solder. Finally, an insulating material such as a coating of solder mask 70 and 72 is provided. Photo-imageable solder mask is utilized. Preferably, the insulating coating has a color which matches the color of the existing traces on the printed circuit board to be modified. Matching of the color aids in maintaining the professional appearance of the circuit board.

Figure 4:
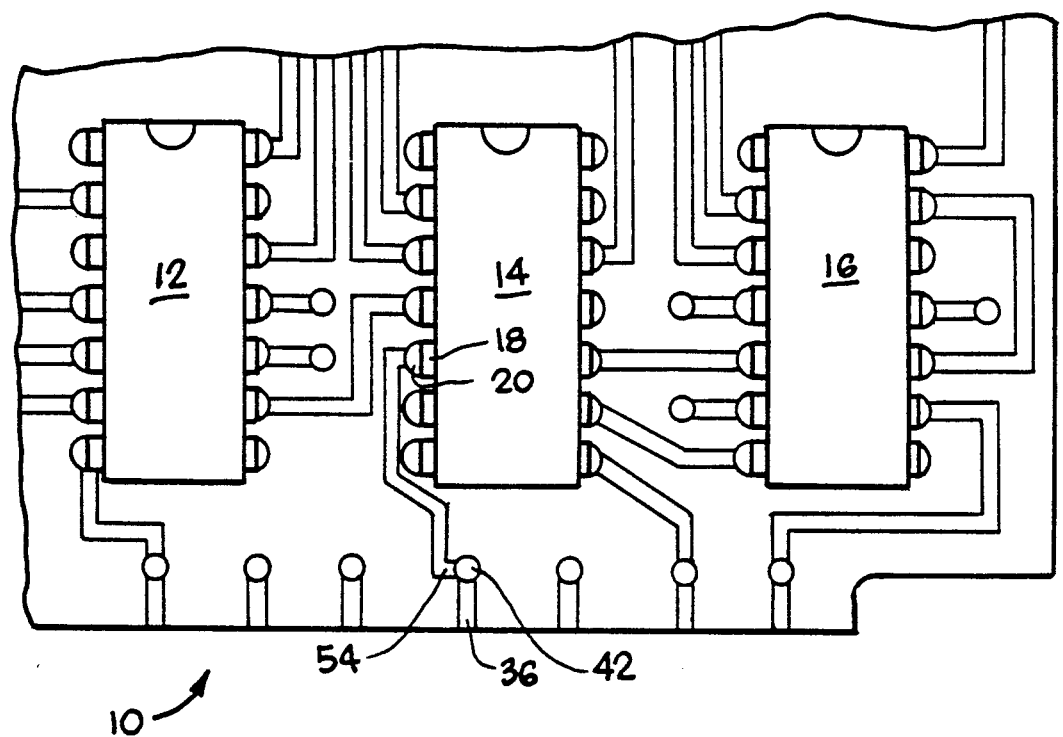
FIG. 4 is a top partial view of a printed circuit board of FIG. 1 having a prerouted board trace from the frame of FIG. 2.

Referring now to FIG. 4, modification of the printed circuit board 10 then becomes an easy, error-free task. For each printed circuit board to be modified, a prerouted trace 54 is removed from the panel and the lands which support the trace 54 to the panel are clipped. The annular pads at the opposed ends of the trace 54 are aligned with the via 42 of the conductive finger 36 and the through-hole 20 of the appropriate pin 18. Reflowing of solder at the via 42 and the pin 18 bonds the trace 54 to the circuit board 10. Optionally, the underside of the trace 54 may be provided with a pressure sensitive, hot-melt or other adhesive so that the trace itself is fixed to the board.

When the trace 54 is connected to the printed circuit board 10 after loading of the integrated circuit packages 12, 14 and 16, the pin 18 must be lifted in order to provide the desired electrical communication between the conductive finger 36 and the integrated circuit package 14. However, the trace 54 is preferably fixed in place prior to loading of the board. Alternatively, the connection from the conductive finger 36 to the pin 18 may be made by a trace on the solder side of the board, rather than the component side.

While the traces have been described and illustrated as remaining in contact with the printed circuit board throughout the path of the traces, the lay-flat traces may be fabricated or may be maneuvered after fabrication to include an upward extension for attachment to a raised connection site.

We claim:

1. A method of electrically connecting first and second locations on a printed circuit board having a circuit pattern of conductive traces fabricated thereon comprising:
    identifying first and second locations on a printed circuit board for electrical connection of said location,
    selecting a path having at least one turn for placement of a board trace in contact with said printed circuit board from said first location to said second location,
    fabricating a plurality of substantially identical, lay-flat traces in a frame means for supporting said lay-flat traces such that said lay-flat traces area each configured to follow said selected path,
    removing one of said lay-flat traces from said frame means, and
    laying said removed lay-flat trace along said selected path in parallel relation to said printed circuit board and bonding opposed ends of said lay-flat trace to said first and second locations to maintain said parallel relation.

2. The method of claim 1 wherein said step of fabricating lay-flat traces includes use of one of a chemical milling technique and a stamping technique on a panel of metal to form said lay-flat traces in said panel, said panel acting as said frame means, said step of fabricating further including leaving lands to extend from said lay-flat traces to said panel.

3. The method of claim 1 wherein said step of fabricating lay-flat traces includes use of photo tooling to etch said lay-flat traces in said frame means, and wherein said method further comprises use of photo tooling to provide selective coating of said lay-flat traces with an electrically insulating material, said lay-flat traces remaining exposed at said opposed ends for said bonding to first and second locations.

4. The method of claim 1 wherein said step of fabricating said lay-flat traces includes providing annular pads at opposed ends of longitudinally extending conductive traces.

5. The method of claim 2 wherein said panel is made of a first metal, said step of fabricating further including plating said lay-flat traces with a second metal after said use of one of said chemical milling technique and said stamping technique.

6. The method of claim 1 wherein said step of fabricating is implemented to provide board traces similar in appearance to conductive traces on said printed circuit board.

7. The method of claim 1 wherein said step of fabricating includes providing a plurality of turns to each of said lay-flat traces, said removed lay-flat trace having a raised end for attachment above the surface of said printed circuit board.

8. A method of electrically connecting first and second locations on a substrate having a plurality of substrate traces fabricated thereon comprising:
  selecting a path on said substrate from said first location to said second location,
  fabricating a plurality of low-profile meandering conductive traces by removing a pattern of metal from a metallic panel, said removing of metal being in a pattern to configure said plurality of meandering conductive traces so that each conductive trace is adapted to track said selected path,
  attaching pads to the opposed ends of said meandering conductive traces,
  flatly placing one of said meandering conductive traces on said substrate to follow said selected path, and
  bonding said pads of said one meandering conductive trace to said first and second locations in a manner to provide lay-flat positioning of said one meandering conductive trace along said selected path.

9. The method of claim 8 wherein said step of fabricating said meandering conductive traces includes removing said metal in a pattern to leave lands extending from said meandering conductive traces to said metallic panel, said metallic panel thereby acting as a support frame for said meandering conductive traces.

10. The method of claim 9 wherein said step of attaching pads is a step performed while said meandering conductive traces are attached to said metallic panel by said lands.

11. The method of claim 8 wherein said step of fabricating said meandering conductive traces includes applying a coating of insulating material.

12. The method of claim 8 wherein said step of placing said one meandering conductive trace includes bonding said trace to said substrate.

13. The method of claim 11 wherein said step of fabricating said meandering conductive traces further includes coating said conductive traces with a metallic material prior to said application of insulating material.

14. The method of claim 8 wherein said step of fabricating said meandering conductive traces is carried out to provide conductive traces similar to the board substrate traces.

15. A method of electrically modifying a printed circuit by connecting first and second locations on a printed circuit board having a plurality of board traces fabricated thereon comprising:
  selecting a path on said printed circuit board to avoid crossing of said board traces from said first location to said second location,
  forming a plurality of low-profile, substantially identical conductive traces supported in a metallic panel by lands extending between said panel and said conductive traces, said conductive traces being configured to track said selected path and to include circular pads at opposed ends,
  disconnecting one of said conductive traces from said panel, and
  Bonding said pads of said one conductive trace to said first and second locations such that said one conductive trace lays flat against said printed circuit board along said selected path.

16. The method of claim 15 wherein said step of forming said conductive traces includes removing metal from said panel to define said conductive traces and said lands.

17. The method of claim 16 wherein said step of forming said conductive traces further includes attaching said pads after said removing of metal.

18. The method of claim 15 wherein said step of bonding said pads is performed by soldering said pads to said first and second locations.

19. The method of claim 16 wherein said step of forming said conductive traces includes use of a chemical milling technique.

20. The method of claim 15 wherein said step of forming said conductive traces includes providing at least one turn.

* * * * *

UNITED STATES PATENT AND TRADEMARK OFFICE
CERTIFICATE OF CORRECTION

PATENT NO. : 5,060,370

DATED : October 29, 1991

INVENTOR(S) : James W. Scales, Jr. et al.

It is certified that error appears in the above-identified patent and that said Letters Patent is hereby corrected as shown below:

Claim 1, column 6, line 23, "connection of said location"
    should read - - connection of said locations - -;
    line 31, "said lay-flat traces area" should read
    - - said lay-flat traces are - -.

Claim 15, column 8, line 22, "Bonding said pads" should read
    - - bonding said pads - -.

Signed and Sealed this

Eighteenth Day of February, 1992

*Attest:*

HARRY F. MANBECK, JR.

*Attesting Officer*     *Commissioner of Patents and Trademarks*